United States Patent
Berberich

(10) Patent No.: US 7,269,033 B2
(45) Date of Patent: Sep. 11, 2007

(54) SUPPRESSOR DEVICE

(75) Inventor: Reinhold Berberich, Frankfurt (DE)

(73) Assignee: Siemens Aktiengesellschaft, München (DE)

( * ) Notice: Subject to any disclaimer, the term of this patent is extended or adjusted under 35 U.S.C. 154(b) by 190 days.

(21) Appl. No.: 10/522,090

(22) PCT Filed: Jun. 18, 2003

(86) PCT No.: PCT/DE03/02031

§ 371 (c)(1),
(2), (4) Date: Jan. 21, 2005

(87) PCT Pub. No.: WO2004/017471

PCT Pub. Date: Feb. 26, 2004

(65) Prior Publication Data

US 2005/0221638 A1    Oct. 6, 2005

(30) Foreign Application Priority Data

Jul. 22, 2002  (DE) .............................. 102 33 318

(51) Int. Cl.
*H05K 9/00* (2006.01)
(52) U.S. Cl. .................................... 361/818; 361/761
(58) Field of Classification Search ............... 439/676, 439/941, 344, 620.09–620.29; 361/818; 29/876, 881
See application file for complete search history.

(56) References Cited

U.S. PATENT DOCUMENTS

| | | | | |
|---|---|---|---|---|
| 4,820,174 A | * | 4/1989 | Farrar et al. ................... 439/95 |
| 5,152,699 A | * | 10/1992 | Pfeifer ................... 439/620.16 |
| 5,242,318 A | * | 9/1993 | Plass ....................... 439/620.1 |
| 5,473,109 A | * | 12/1995 | Plankl et al. ................ 174/363 |
| 5,509,825 A | * | 4/1996 | Reider et al. .......... 439/620.09 |
| 5,562,498 A | | 10/1996 | Brandenburg et al. |
| 5,622,524 A | | 4/1997 | Dirmeyer |
| 5,865,648 A | * | 2/1999 | Clyatt, III .............. 439/620.09 |
| 6,142,831 A | * | 11/2000 | Ashman et al. ........ 439/620.15 |
| 6,506,079 B1 | * | 1/2003 | Dingenotto et al. ..... 439/620.1 |
| 6,646,858 B2 | * | 11/2003 | Dingenotto et al. ........ 361/302 |

FOREIGN PATENT DOCUMENTS

DE    G 90 16 083.5    3/1991

* cited by examiner

*Primary Examiner*—Dean A. Reichard
*Assistant Examiner*—Hung S. Bui
(74) *Attorney, Agent, or Firm*—Cohen Pontani Lieberman & Pavane LLP

(57) ABSTRACT

A suppressor device for an electronic device comprising a plug-in device, comprising at least one plug element, which is arranged on a electrically conducting housing of the electronic device. A printed circuit board is arranged in the housing and bears an electronic circuit leading to the plug element. A capacitor is connected to the plug element and to the potential of the housing. The capacitor is arranged on the printed circuit board which protrudes from the inner part of the housing through an opening with a part thereof and which is also extends from the inner part of the housing to the outer side of the housing. The plug element is conductively connected to the capacitor and the circuit on the part of the printed circuit board located on the outer part of the housing.

29 Claims, 4 Drawing Sheets

SUPPRESSOR DEVICE

PRIORITY CLAIM

This is a U.S. national stage of application No. PCT/DE2003/002031, filed on Jun. 18, 2003. Priority is claimed on the following application(s): Country: Germany, Application No.: 102 33 318.1, Filed: Jul. 22, 2002.

BACKGROUND OF THE INVENTION

1. Field of the Invention

The invention relates to an interference suppression device for an electronic appliance, the interference suppression device having a plug device, with at least one plug element arranged on an electrically conductive housing of the electronic appliance, a printed circuit board arranged in the housing and bearing an electrical and/or electronic circuit to which the plug element is connected, and a capacitor connected on the one hand to the plug element and on the other hand to the potential of the housing.

2. Description of the Prior Art

It is known with such interference suppression devices to pass the plug elements of the plug device through cutouts in a plug cover into the housing interior to connect them there to the capacitor and the circuit. Via the cutouts and metal parts, including the plug elements, which protrude into the housing interior from the outside, radio-frequency interference radiation of, in particular, >approximately 400 MHz is conducted and irradiated into the interior of the metal housing, which is actually provided for shielding purposes, and may impair the operation of the circuit of the electronic appliance owing to the high-energy radiation.

SUMMARY OF THE INVENTION

An object of the invention is to provide an interference suppression device which, given a simple and cost-effective design, ensures effective shielding against, in particular, radio-frequency interference radiation and is also suitable for mass production.

This object is achieved according to the invention by an interference suspension device for an electronic appliance, including a plug device with at least one plug element arranged on an electrically conductive housing of the electronic appliance, a printed circuit board arranged in the housing and bearing an electrical and/or electronic circuit to which the plug element is connected, and a capacitor connected on the one hand to the plug element and on the other hand to the potential of the housing, the capacitor arranged on the printed circuit board, wherein one part of the printed circuit board protrudes out of the housing interior of the electronic appliance housing through an opening, and the printed circuit board extends from the housing interior to a housing exterior. The plug element on that part of the printed circuit board which is located at the housing exterior being conductively connected to the capacitor and the circuit on the printed circuit board. printed circuit board which is located in the housing exterior being conductively connected to the capacitor and the circuit.

This design has the advantage that the interference suppression takes place even on the outside of the electronic appliance and interference radiation does not even reach the housing interior. Such an interference suppression device has few components and can therefore be assembled in a simple and cost-effective manner. In this case, without significant additional complexity, that part of the printed circuit board which extends from the housing interior to the housing exterior forms, together with the housing having ground potential and in a simple manner, a bushing capacitor, each individual plug element being filtered effectively.

Production may be simple if the capacitor comprises a first and a second capacitor face which are arranged opposite one another such that they are separated by an insulating layer, the first capacitor face being electrically conductively connected to the potential of the housing, and the second capacitor face being electrically conductively connected to the circuit. The insulating layer may be formed in a component-saving manner by the printed circuit board.

In order to make contact in a simple manner with the housing, the first capacitor face may be arranged on the surface of the printed circuit board.

Particularly effective shielding is achieved if the printed circuit board has two further capacitor faces, which lie one above the other and which are electrically insulated from one another, for the purpose of forming a further capacitor for the same plug element, the third capacitor face being electrically connected to the plug element and the fourth capacitor face being electrically connected to the housing potential, it being possible in this case too to make contact in a simple manner with the housing if the fourth capacitor face is arranged on the surface of the printed circuit board.

It goes without saying that, in addition, more than two capacitors may also be provided. For this purpose, the printed circuit boards are preferably multilayer printed circuit boards which may have more than four layers on which the capacitor faces are arranged.

If the first and the fourth capacitor faces are conductively connected to one another by means of plated-through holes which enclose between them the second and the third capacitor faces and preferably extend approximately on the plane of the housing wall, the second and third capacitor faces are surrounded by ground potential, which leads to a reduction in the effective opening cross section and thus to a further increase in the shielding.

For cost-effective production of the capacitor faces, one or more of the capacitor faces may be capacitor coatings on the printed circuit board.

For signal transmission purposes, the plug element(s) or the capacitor faces which are conductively connected to the plug elements are preferably connected to the circuit via signal lines.

In this case, the signal lines can be produced in a simple and cost-effective manner if they are layer lines applied to the printed circuit board.

In order to increase the shielding effect, the opening in the housing preferably tightly encloses the printed circuit board passed through it.

A connection to the ground potential is made in a simple manner and without significant component complexity if the opening region of the housing is in conductive contact with a first and/or fourth capacitor face, which is/are arranged on the surface of the printed circuit board.

In this case, no special components are required if the opening region of the housing bears in a resilient manner against the first and/or fourth capacitor face. At the same time, effective closure of the opening is produced.

Mechanically robust contact is made with the ground potential by the opening region of the housing being connected to the first and/or fourth capacitor face by a connecting element, in particular by a rivet.

The opening region of the housing may also be connected in an interlocking manner to the first and/or fourth capacitor face, it being possible for this to take place in a simple manner by part of the opening region of the housing being inserted in a corresponding cutout in the first and/or fourth capacitor face with a press fit.

Both mechanically robust contact is made with the ground potential of the opening with effective shielding is achieved if the opening region of the housing is conductively connected to the first and/or fourth capacitor face by adhesive bonding or soldering.

A further connection to the ground potential is achieved if the housing is capacitively coupled to the first and/or fourth capacitor face.

To further increase the shielding effect, the capacitor and/or the further capacitor may be connected to the circuit by an interference suppression capacitor.

In order to optimize the shielding in the region of the opening further still by reducing the effective opening cross section, the housing wall may have shielding arms lying adjacent to one another in the region of the opening, in which the shielding arms are short in the regions of the capacitors extending from the housing exterior to the housing interior and rest with their free ends on the first capacitor face, and the shielding arms are long in the regions free of capacitors extending from the housing exterior to the housing interior and extend through through-openings in the printed circuit board until they come to bear with their free ends against a wall part of the housing.

In this case, contact can be made with the ground potential of the housing in a simple manner by the shielding arms bearing on the first capacitor face and the wall of the housing with resilient prestress.

Production may use few components and may be cost-effective if the housing wall is in the form of a stamped/bent part in the region of the opening.

For further shielding purposes, that part of the printed circuit board which is located in the housing exterior and capacitors as well as the plug elements can be arranged in an outer, electrically conductive housing chamber.

BRIEF DESCRIPTION OF THE DRAWINGS

Exemplary embodiments of the invention are described in more detail below and are illustrated in the drawing, in which.

DETAILED DESCRIPTION OF THE PREFERRED EMBODIMENTS

Figure 1:
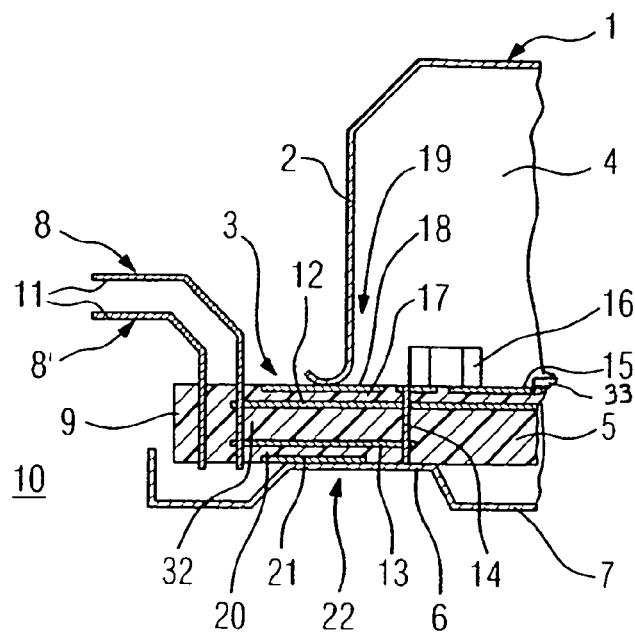
FIG. 1 is a cross sectional view through a first exemplary embodiment of an interference suppression device.

The interference suppression devices illustrated in the figures have a housing 1 made of sheet metal for an electronic appliance, which has an opening 3 at a lateral housing wall 2. A printed circuit board 5, which rests on elevated embossed areas 6 of the base 7 of the housing 1, is arranged in the housing interior 4. The printed circuit board 5 bears an electronic circuit 33 with which contact can be made from the outside via plug elements 8, 8' and which is fed low-frequency signals via the plug elements 8, 8'.

The printed circuit board 5 has a part 9, which extends through the opening 3 to the housing exterior 10, the base 7 of the housing 1 protruding laterally and covering the entire lower region of the printed circuit board 5, including the part 9.

The plug elements 8, 8' have plug pins 11, which protrude horizontally away from the housing 1 and onto which a corresponding opposing plug pair (not shown) can be plugged. Those ends of the plug elements 8, 8' which are opposite the plug pins 11 protrude vertically through the printed circuit board 5. The plug element 8 is conductively connected to second and third capacitor faces 12 and 13 arranged on the printed circuit board 5, an insulating layer 32 being arranged between the capacitor faces 12 and 13. The second and third capacitor faces 12 and 13 are connected to one another via a connection 14, and are connected to the circuit 33 via an interference suppression capacitor 16 and a signal line 15.

The second and third capacitor faces 12 and 13 in this case extend from the housing exterior 10 through the opening 3 into the housing interior 4. A first capacitor face 18, which forms a capacitor 19 with the second capacitor face 12, is arranged on the upper surface of the printed circuit board 5 such that it lies opposite and parallel to the second capacitor face 12 and such that they are separated by an insulating layer 17.

In the same manner, a fourth capacitor face 21, which forms a further capacitor 22 with the third capacitor face 13, is arranged on the lower surface of the printed circuit board 5 such that it lies opposite and parallel to the third capacitor face 13 and such that they are separated by an insulating layer 20.

The figures show the connection of the capacitors 19 and 22 to a plug element 8. The capacitors associated with the further plug element 8' are located on a sectional plane different to that illustrated.

In exactly the same way as the second and third capacitor faces 12 and 13, the first and fourth capacitor faces 18 and 21 also extend from the housing exterior 10 through the opening 3 into the housing interior 4. In this case, that part 9 of the printed circuit board 5 which extends through the opening 3 is tightly enclosed by the opening 3 in the housing 1.

In the exemplary embodiments in FIGS. 1, 3, 5, 6 and 7, the fourth capacitor face 21 rests on the embossed area 6 of the base 7 and is thus connected to the ground potential of the housing 1.

In the figures, the first capacitor face 18 is connected to the ground potential of the housing 1 by the housing wall 2 resting on the first capacitor face 18 in the region of the opening 3.

Figure 2:
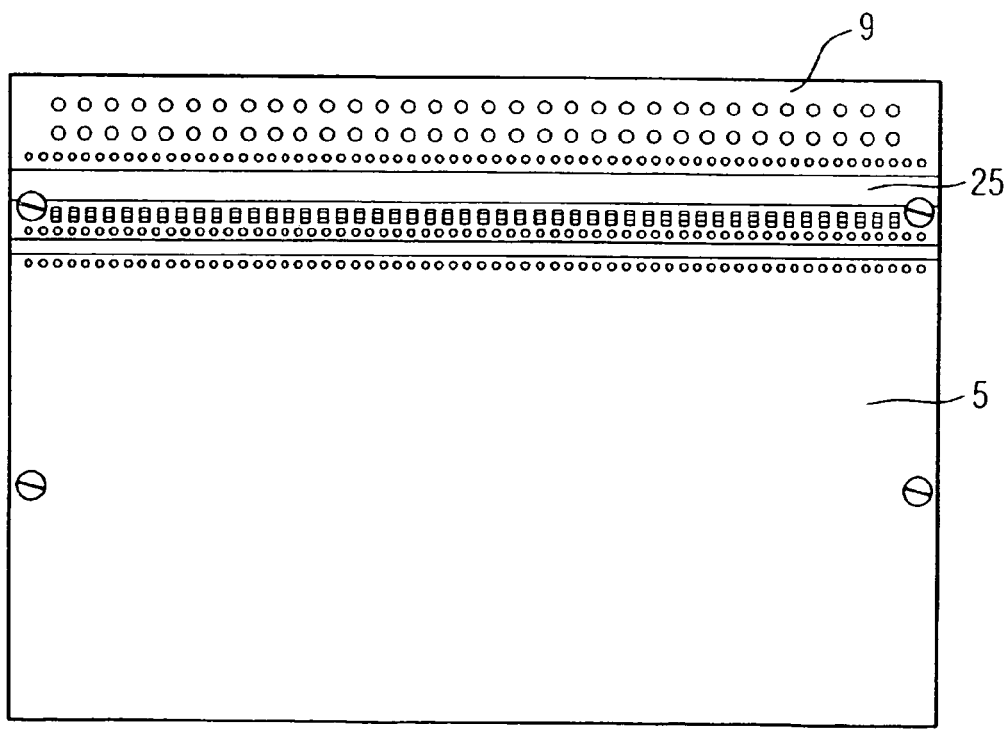
FIG. 2 is a plan view of the printed circuit board of the interference suppression device shown in FIG. 1.
Figure 3:
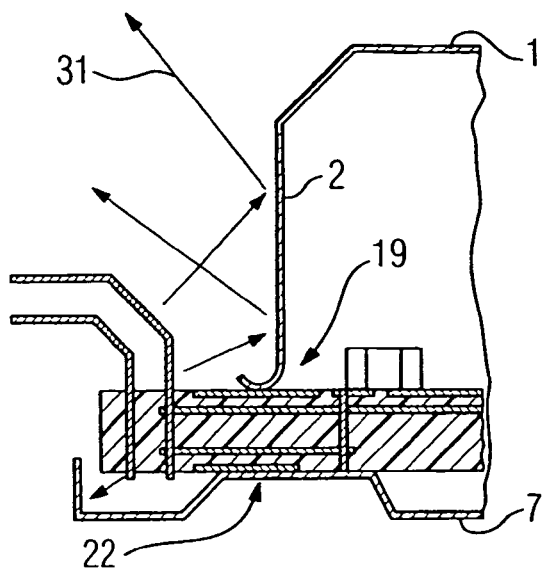
FIG. 3 is a cross sectional view of the interference suppression device shown in FIG. 1 with an illustration of the interference radiation.

In the exemplary embodiment in FIGS. 1 to 3, the housing wall 2 is made of resilient sheet metal and rests with resilient prestress on a contact region 25 of the first capacitor face 18.

Figure 4:
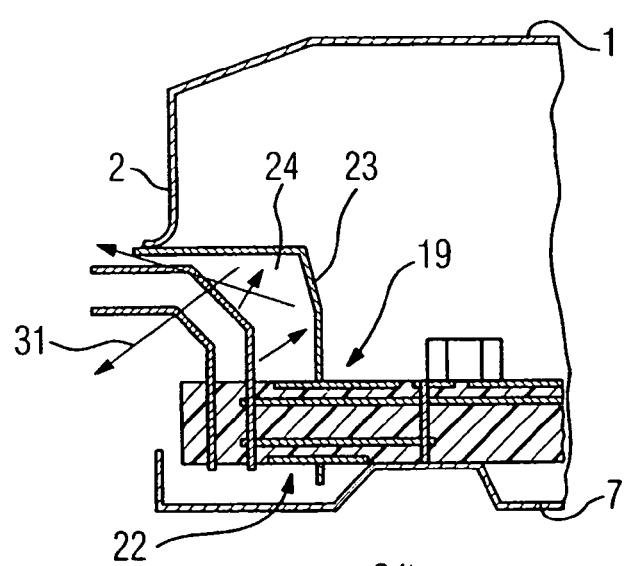
FIG. 4 is a cross sectional view through a second exemplary embodiment of an interference suppression device.
Figure 5:
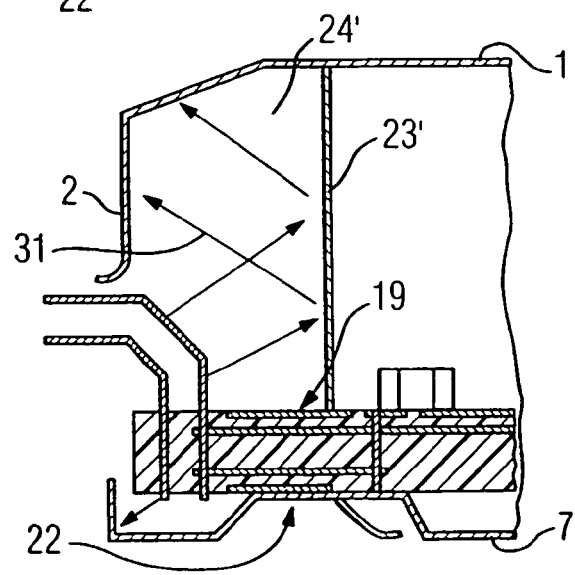
FIG. 5 is a cross sectional view through a third exemplary embodiment of an interference suppression device.
Figure 6:
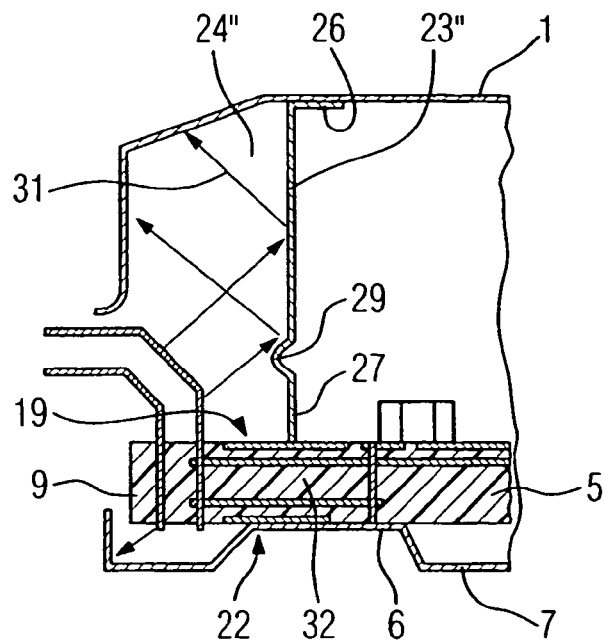
FIG. 6 is a cross sectional view through a fourth exemplary embodiment of an interference suppression device in the region of a short shielding arm.
Figure 7:
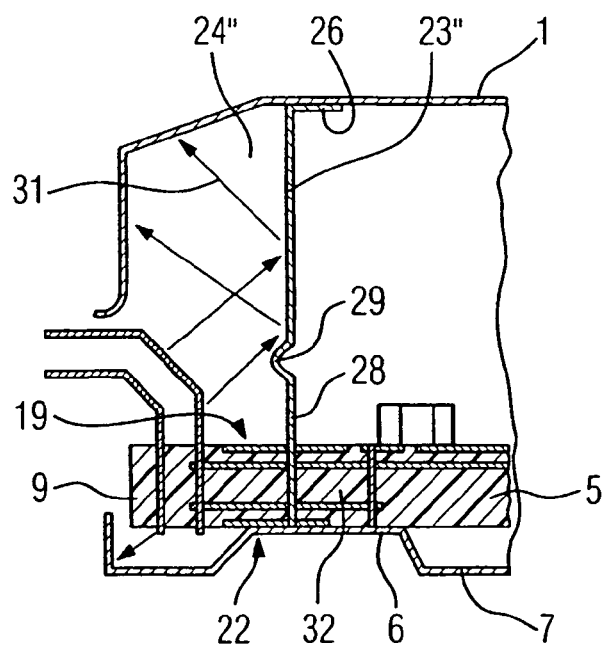
FIG. 7 is a cross sectional view through the interference suppression device shown in FIG. 6 in the region of a long shielding arm.
Figure 8:
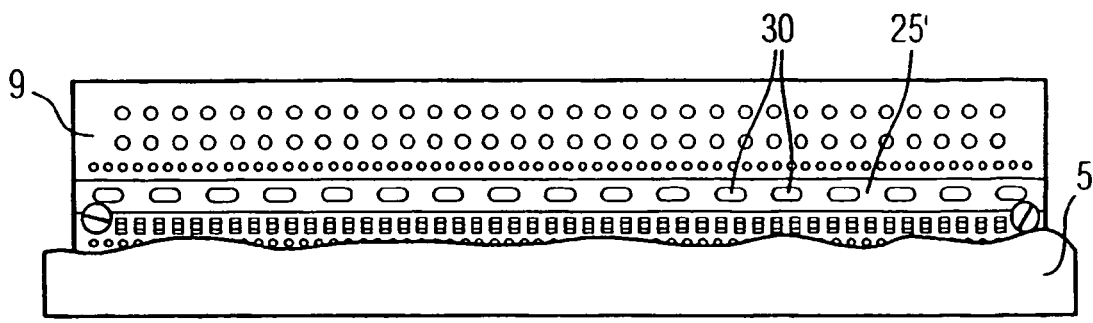
FIG. 8 is a plan view of part of the printed circuit board of the interference suppression device shown in FIG. 6.

In FIG. 4, the housing wall 2 is of two-part design in which the housing 1 largely covers the plug elements 8, 8', and said plug elements 8, 8' are surrounded by an inner cover 23 of the housing wall 2 so as to form a housing chamber 24. In this case, the opening 3 is formed at the inner cover 23 which is soldered in the opening region to contact regions of both the first capacitor face 18 and the fourth capacitor face 21.

Figure 9:
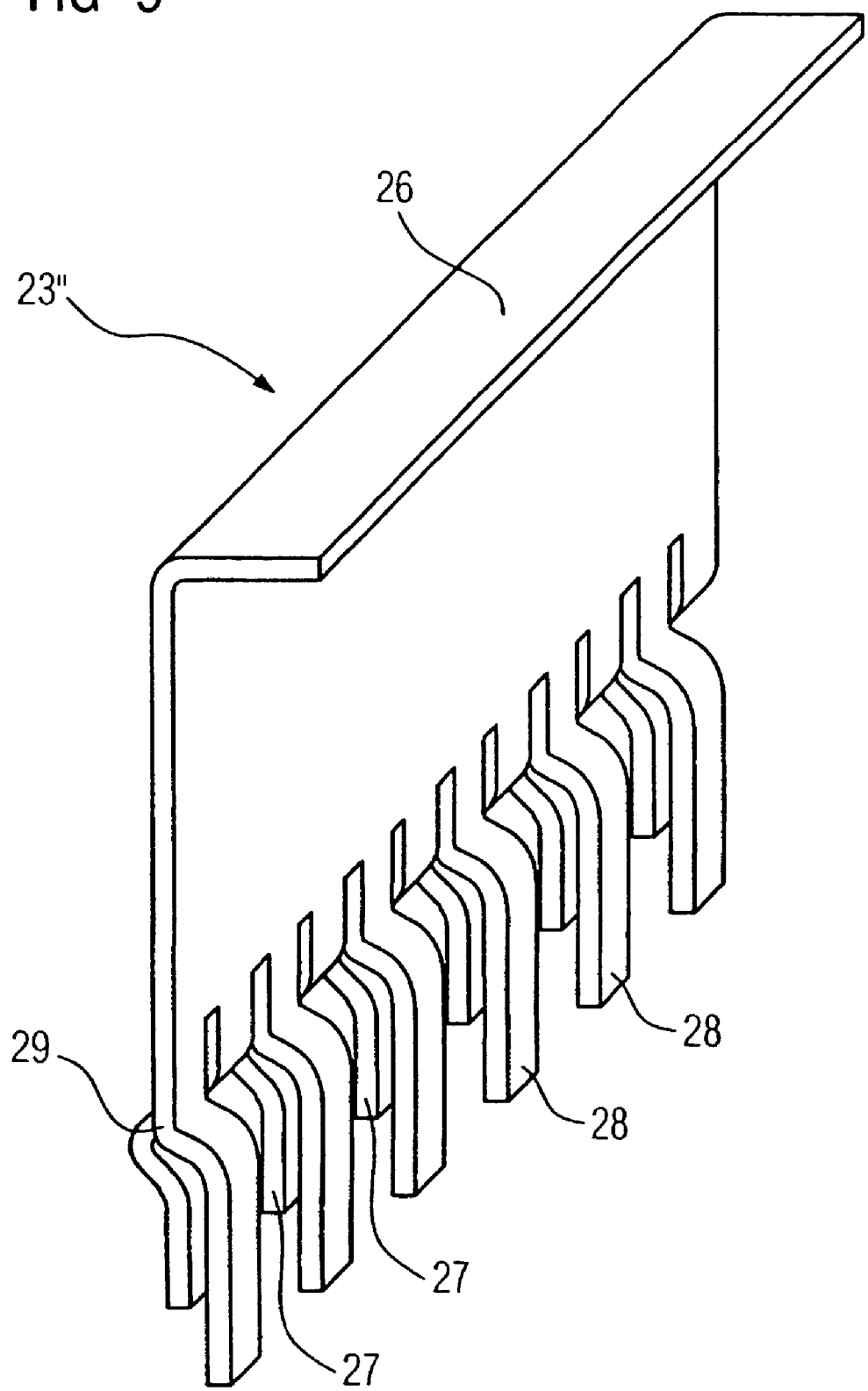
FIG. 9 is a perspective view of the housing wall in the region of the opening of the interference suppression device shown in FIG. 6.

In the region in which they touch, the housing wall 2 and the inner cover 23 bear against one another in a resilient manner. In the exemplary embodiment in FIG. 5, a housing chamber 24' is formed by an inner cover 23' in a similar way to that in FIG. 4. In this case, the inner cover 23' is soldered at its upper end to the inner wall of the housing 1 and at its end which rests in a resilient manner on the contact region of the first capacitor face 18. In the exemplary embodiment in FIGS. 6 to 9, as in FIG. 5, the housing wall 2 and thus a housing chamber 24" is formed by an inner cover 23". This inner cover 23" in the form of a stamped/bent part made of resilient sheet metal is illustrated as a detail in FIG. 9 and has at its upper end a bent-back section 26 with which it is riveted to the upper wall of the housing 1. At its end facing the printed circuit board 5, the inner cover 23" is formed with shielding arms which lie adjacent to one another and which are alternately short shielding arms 27 and long shielding arms 28.

All of the shielding arms 27 and 28 have a bulge 29 in their central region such that they are resilient in their longitudinal extent.

The short shielding arms 27 rest with the end side of their free end in a resilient manner on the contact region 25' of the first capacitor face 18.

Corresponding to the position of the long shielding arms 28, through-openings 30 are formed in the printed circuit board 5, through which through-openings 30 the long shielding arms 28 protrude and, with the end side of their free ends, bear in a resilient manner against the embossed area 6 of the base 7.

FIGS. 3 to 7 show, by means of arrows 31, the radio-frequency interference radiation which is prevented from penetrating into the housing interior 4 by the interference suppression device.

What is claimed is:

1. An interference suppression device for an electronic appliance, the electronic appliance having an electrically conductive housing, said interference suppression device comprising:
a plug device having at least one plug element;
a printed circuit board having a circuit connected to said at least one plug element, said printed circuit board having an external portion protruding through an opening in the electronic appliance housing to an exterior of the electronic appliance housing and an internal portion extending within an interior of the electronic appliance housing; and
a first capacitor arranged on said printed circuit board and connected between said at least one plug element and a potential of the electronic appliance housing, said at least plug element being conductively connected to said first capacitor and said circuit at said external portion of said printed circuit board.

2. The interference suppression device of claim 1, wherein said first capacitor comprises first and second capacitor faces and an insulating layer, said first and second capacitor faces being arranged opposite one another such that they are separated by said insulating layer, said first capacitor face being conductively connected to the potential of the electronic appliance housing, and said second capacitor face being conductively connected to said circuit.

3. The interference suppression device of claim 2, wherein said insulating layer is formed by a portion of said printed circuit board.

4. The interference suppression device of claim 2, wherein said first capacitor face is arranged on a surface of said printed circuit board.

5. The interference suppression device of claim 4, wherein said printed circuit board includes a second capacitor including third and fourth capacitor faces which lie one above the other and which are electrically insulated from one another, said third capacitor face being conductively connected to said at least one plug element and said fourth capacitor face being conductively connected to the electronic appliance housing potential.

6. The interference suppression device of claim 5, wherein said fourth capacitor face is arranged on a surface of said printed circuit board.

7. The interference suppression device of claim 5, wherein said printed circuit board is arranged and dimensioned so that said first capacitor face is connectable to the electronic appliance by an interlocking connection.

8. The interference suppression device of claim 7, wherein said printed circuit board defines cutouts arranged and dimensioned for receiving corresponding portions of the opening region of the electronic appliance housing with a press fit.

9. The interference suppression device of claim 5, wherein said first and fourth capacitor faces are conductively connected by plated-through holes which enclose between them the second and the third capacitor faces and extend approximately on the plane of the housing wall.

10. The interference suppression device of claim 5, wherein said printed circuit board is arranged and dimensioned so that one of said first and fourth capacitor faces is connectable to the electronic appliance by an interlocking connection.

11. The interference suppression device of claim 10, wherein said printed circuit board defines cutouts arranged and dimensioned for receiving corresponding portions of the opening region of the electronic appliance housing with a press fit.

12. The interference suppression device of claim 5, wherein at least one of said first and fourth capacitor faces is arranged for conductively contacting the electronic appliance housing proximate the opening of the electronic appliance housing.

13. The interference suppression device of claim 12, wherein said at least one of said first and fourth capacitor faces is arranged such that the electronic appliance housing bears resiliently against said at least one of said first and fourth capacitor faces proximate the opening.

14. The interference suppression device of claim 12, further comprising a connecting element for connecting said first capacitor face to the opening region of the electronic appliance housing.

15. The interference suppression device of claim 12, further comprising a connecting element for connecting said one of said first and fourth capacitor face to the opening region of the electronic appliance housing.

16. The interference suppression device of claim 15, wherein said connecting element comprises a rivet.

17. The interference suppression device of claim 2, wherein at least one of said first and second capacitor faces includes a capacitor coating on the printed circuit board.

18. The interference suppression device of claim 2, wherein said first capacitor face is arranged for conductively contacting the electronic appliance housing proximate the opening of the electronic appliance housing.

19. The interference suppression device of claim 18, wherein said first capacitor face is arranged such that the opening region of the electronic appliance housing bears resiliently against said first capacitor face.

20. The interference suppression device of claim 2, further comprising one of an adhesive bond and solder connection for conductively connecting said first capacitor face to the electronic appliance housing.

21. The interference suppression device of claim 2, wherein said printed circuit board is dimensioned and arranged such that said printed circuit board is tightly enclosed in the opening in the electronic appliance housing and said first capacitor face is capacitively coupled to the electronic appliance housing.

22. The interference suppression device of claim 1, further comprising signal lines connecting said circuit to one of said at least one plug element and said second capacitor face.

23. The interference suppression device of claim 22, wherein said signal lines comprise layer lines applied to said printed circuit board.

24. The interference suppression device of claim 1, wherein said printed circuit board is dimensioned and arranged such that said printed circuit board is tightly enclosed in the opening in the electronic appliance housing.

25. The interference suppression device of claim 1, further comprising an interference suppression capacitor, said first capacitor being connected to said circuit by said interference suppression capacitor.

26. The interference suppression device of claim 1, further comprising a housing wall of the electronic appliance housing, said housing wall having shielding arms lying adjacent to one another in the region of the opening, said shielding arms comprising short shielding arms in the regions of said first capacitor and extending from the housing exterior to the housing interior, said short shielding arms having free ends resting on said first capacitor face, and said shielding arms further comprising long shielding arms extending in regions free of said first capacitors and extending from the housing exterior to the housing interior through through-openings defined in said printed circuit board, said long shielding arms having free ends bearing against a wall part of the housing.

27. The interference suppression device of claim 26, wherein said shielding arms bear on said first capacitor face and the wall of the housing with resilient prestress.

28. The interference suppression device of claim 26, wherein said housing wall comprises a stamped and bent part in the region of the opening.

29. The interference suppression device of claim 1, wherein each of said external portion of said printed circuit board, said first capacitor and said at least one plug element are arranged in an outer electrically conductive housing chamber of the electronic appliance housing separate from the interior of the electronic appliance housing.

* * * * *